(12) United States Patent
Fu et al.

(10) Patent No.: US 9,722,559 B2
(45) Date of Patent: Aug. 1, 2017

(54) HYBRID FIBER AMPLIFIER AND METHOD FOR ADJUSTING GAIN AND GAIN SLOPE THEREOF

(71) Applicant: Accelink Technologies Co., Ltd., Wuhan (CN)

(72) Inventors: Chengpeng Fu, Wuhan (CN); Cuihong Zhang, Wuhan (CN); Tao Xiong, Wuhan (CN); Menghui Le, Wuhan (CN); Jintao Tao, Wuhan (CN); Zhenyu Yu, Wuhan (CN); Yunyu Jing, Wuhan (CN); Qinlian Bu, Wuhan (CN); Chunping Yu, Wuhan (CN)

(73) Assignee: Accelink Technologies Co., Ltd. (CN)

( * ) Notice: Subject to any disclaimer, the term of this patent is extended or adjusted under 35 U.S.C. 154(b) by 0 days.

(21) Appl. No.: 14/426,047

(22) PCT Filed: Sep. 27, 2012

(86) PCT No.: PCT/CN2012/082101
§ 371 (c)(1),
(2) Date: Mar. 4, 2015

(87) PCT Pub. No.: WO2014/036764
PCT Pub. Date: Mar. 13, 2014

(65) Prior Publication Data
US 2015/0214913 A1    Jul. 30, 2015

(30) Foreign Application Priority Data
Sep. 5, 2012   (CN) .......................... 2012 1 0325897

(51) Int. Cl.
*H01S 3/067*   (2006.01)
*H01S 3/30*    (2006.01)
(Continued)

(52) U.S. Cl.
CPC ............. *H03G 3/3084* (2013.01); *H03F 3/08* (2013.01); *H03F 3/087* (2013.01); *H04B 10/294* (2013.01);
(Continued)

(58) Field of Classification Search
CPC .. H01S 3/06754; H01S 3/06758; H01S 3/302; H01S 2301/04; H04B 10/2942
See application file for complete search history.

(56) References Cited

U.S. PATENT DOCUMENTS 6,429,966 B1 *  8/2002  Hazell ................. H01S 3/06758
                                                         359/334
6,441,950 B1    8/2002  Chen et al.
(Continued)

FOREIGN PATENT DOCUMENTS

CN       2631132      8/2004
CN     101262283      9/2008
(Continued)

OTHER PUBLICATIONS

International Search Report for Application No. PCT/CN2012/052101 dated Jun. 13, 2013.

*Primary Examiner* — Eric Bolda
(74) *Attorney, Agent, or Firm* — Lerner, David, Littenberg, Krumholz & Mentlik, LLP

(57) ABSTRACT

A hybrid fiber amplifier and method of adjusting gain and gain slope of thereof. The hybrid fiber amplifier comprises: RFA and EDFA that does not comprise variable optical attenuator. The RFA comprises pump signal combiner, pump laser group, out-of-band narrow-band filter, and photodetector. The EDFA comprises input coupler, erbium-doped fiber, output coupler, input photodetector, and output photodetector that are connected in sequence. The hybrid fiber amplifier also comprises control module that coordinates and controls EDFA and/or RFA to adjust gain and/or the gain slope based (Continued)

on desired amplification requirements. The EDFA and/or RFA can be coordinated and controlled by using the control module to achieve desired amplification effect. In addition, the EDFA does not comprise the variable optical attenuator, which avoids problems caused by the variable optical attenuator. The hybrid fiber amplifier and method of adjusting gain and gain slope thereof are applicable to technical field of optical communications.

14 Claims, 5 Drawing Sheets

(51) Int. Cl.
    *H03G 3/30*     (2006.01)
    *H04B 10/29*     (2013.01)
    *H04B 10/294*     (2013.01)
    *H04B 10/291*     (2013.01)
    *H03F 3/08*     (2006.01)
    *H01S 3/094*     (2006.01)
    *H01S 3/23*     (2006.01)

(52) U.S. Cl.
    CPC ...... *H04B 10/2916* (2013.01); *H01S 3/06754* (2013.01); *H01S 3/094096* (2013.01); *H01S 3/2375* (2013.01); *H01S 3/302* (2013.01); *H01S 2301/04* (2013.01)

(56) References Cited

U.S. PATENT DOCUMENTS

| | | | |
|---|---|---|---|
| 6,441,952 B1 | 8/2002 | Duan et al. | |
| 7,522,334 B2* | 4/2009 | Stephens | H04B 10/2933 359/334 |
| 7,715,092 B2* | 5/2010 | Bolshtyansky | H04J 14/0221 359/334 |
| 8,767,285 B2* | 7/2014 | Magri | H01S 3/06758 359/334 |
| 8,817,365 B2* | 8/2014 | Eliyahu | H04B 10/2914 359/334 |
| 9,461,437 B2* | 10/2016 | Pelouch | H01S 3/302 |
| 2003/0174390 A1 | 9/2003 | Kakui | |
| 2004/0190122 A1* | 9/2004 | Tanaka | H01S 3/302 359/337 |
| 2007/0297044 A1* | 12/2007 | Qiao | H01S 3/1301 359/337 |
| 2008/0218848 A1 | 9/2008 | Mino | |
| 2011/0141552 A1* | 6/2011 | Ghera | H04B 10/2916 359/334 |
| 2011/0255151 A1* | 10/2011 | Magri | H01S 3/06758 359/334 |
| 2012/0327505 A1* | 12/2012 | Fu | H01S 3/06754 359/334 |
| 2014/0022626 A1* | 1/2014 | Eliyahu | H04B 10/2914 359/334 |

FOREIGN PATENT DOCUMENTS

| | | |
|---|---|---|
| CN | 101588208 | 11/2009 |
| CN | 102307068 | 1/2012 |

* cited by examiner ic Application No. 201210325897.6, filed Sep. 5, 2012,
HYBRID FIBER AMPLIFIER AND METHOD FOR ADJUSTING GAIN AND GAIN SLOPE THEREOF

CROSS-REFERENCE TO RELATED APPLICATIONS

The present application is a national phase entry under 35 U.S.C §371 of International Application No. PCT/CN2012/082101, filed Sep. 27, 2012, which claims priority to Chinese Application No. 201210325897.6, filed Sep. 5, 2012, all of which are hereby incorporated herein by reference.

TECHNICAL FIELD

The invention provides a Hybrid Fiber Amplifier (HFA) and method and apparatus to adjust its gain and gain slope, which can be applicable in field of optical communication.

BACKGROUND

Fiber Amplifier is now indispensable to extend the optical signal transmission distance in optical communication field. In this context, RFA (Raman fiber amplifier) and EDFA (erbium-doped fiber amplifier) have already been widely applied in communication systems. With the gradual commercialization of 100 G-CCS (Coherent Communication System), the demand on RFA is increasing. Meanwhile, as the gain medium of RFA is transmission fiber itself with relatively low gain coefficient, it has unique advantage in improving OSNR (Optical Signal Noise Ratio), while it has low price effectiveness in increasing power. On the contrary, compared with RFA, EDFA has larger noise Figure, but is more price-effective in power amplification. Therefore, it can be considered to use them together in the communication system so as to complement and compensate for each other. Nonetheless, the prior art is absent of a unified control platform to regulate the amplification gain and gain coefficient of amplifier, and the current RFA and EDFA are used and adjusted independently, thus it can hardly meet requirements only by using existed RFA and EDFA in combination manner.

Besides, VOA (variable optical attenuator) is embedded in the current EDFA, wherein it keeps the gain on erbium-doped fiber of EDFA unchanged, and the gain change of EDFA is realized by subtracting the attenuation of VOA from the gain on erbium-doped fiber of EDFA, that is, increasing attenuation of attenuation of VOA to reduce EDFA gain, for example, 1 dB reduction of EDFA gain need increasing attenuation of VOA by 1 dB. Consequently, noise Figure of EDFA in small gain is much greater than that in large gain, while pump laser will waste large amount of power due to attenuation of VOA.

SUMMARY

The object of this invention is to provide a Hybrid Fiber Amplifier (HFA) to overcome the above mentioned defect of the absence of a unified control of RFA and EDFA adjusted independently which cannot realize desired amplification effect, and technical problem of great noise Figure of EDFA with embedded VOA.

According to embodiment of the invention, there is provided a Hybrid Fiber Amplifier comprising a Raman fiber amplifier (RFA) and an erbium-doped optical fiber amplifier (EDFA) without variable optical attenuator, wherein the RFA comprises: pump signal combiner; a group of pump lasers connected to reflection end of the pump signal combiner; an out-of-band narrow-band filter that are connected to the output end of pump signal combiner; and a photodetector that is connected to a reflection end of out-of-band narrow-band filter; wherein the EDFA comprises: an input coupler, an erbium-doped fiber, an output coupler, an input photodetector that is connected to the small end of the input coupler, and an output photodetector that is connected to the small end of output coupler which are connected sequentially, wherein the output end of the out-of-band narrow-band filter is connected to input end of input coupler. The HFA also consists of a control module that, in accordance with desired amplification requirements, controls RFA and/or EDFA to adjust gain and/or gain slope.

Another object of embodiment of the invention is to provide an adjustment method to adjust gain and/or gain slope of HFA that comprises RFA and EDFA without variable optical attenuator. The adjustment method comprising: according to desired amplification requirements, adjusting the gain $G_R$, gain slope $T_R$ of RFA, and/or gain $G_E$, and gain slope $T_E$ EDFA to realize adjustment of total gain $G_H$ and/or total gain slope $T_H$ of HFA.

According to embodiment of the invention, there is provided a control module to coordinate and control RFA and/or EDFA, and according to desired amplification requirements including total gain $G_H$ and/or total gain slope $T_H$ of HFA, adjust the gain and/or gain slope of RFA and/or EDFA, so as to achieve desired amplification effect. Besides, it can avoid the degradation of noise Figure and pump power waste resulted from VOA attenuation since EDFA in HFA does not include VOA. In embodiment of this invention, transient performance is improved, EDFA structure is simplified, method of gain control is simpler, performance is more reliable, cost and power consumption are lowered while enhancing product performance, since pump power is much lower under the same gain without attenuation of VOA.

DETAILED EMBODIMENTS

With drawings and embodiments below, this part is a detailed description about the purpose, technology plan, and strengths of the invention. It should be understood that the embodiment described herein, which is an interpretation of the invention in essence, shall not restrict the invention.

The invention provides a HFA which integrates RFA and EDFA without VOA, adjusts amplification parameters with a control module to control RFA and EDFA, including: controlling RFA to adjust gain and/or gain slope, controlling EDFA to adjust gain, which make amplification effect of HFA meet desired requirements.

To explain the technology plan of the invention, specific embodiments of the invention are provided as follows:

Embodiment 1

Figure 1:
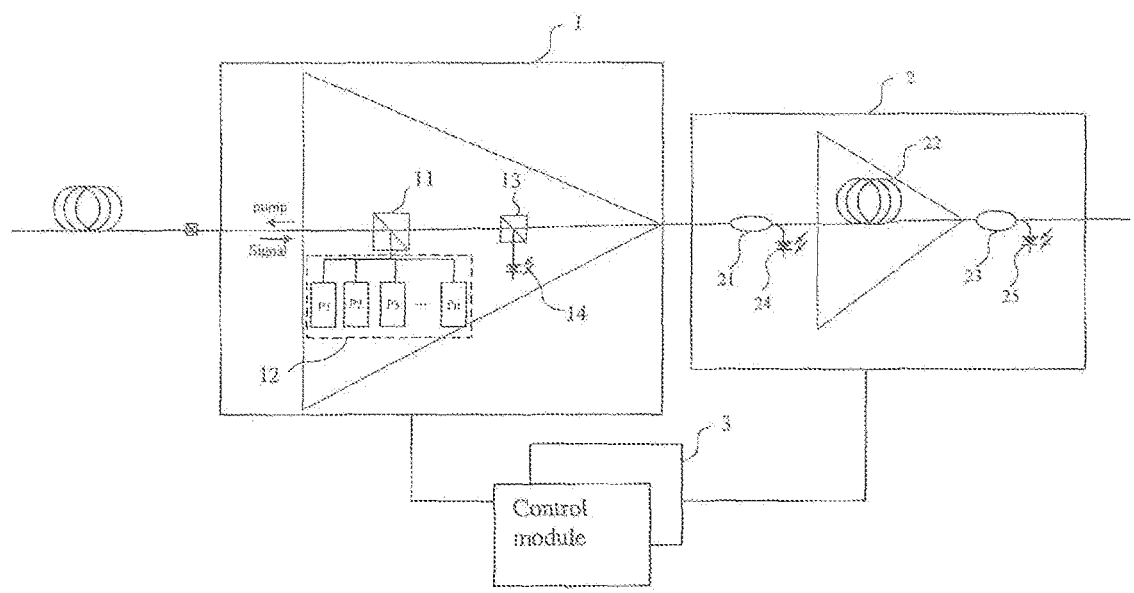
FIG. 1 shows the structure of HFA according to an embodiment of the invention.

As in FIG. 1, it shows structure of the HFA according to first embodiment of the present invention. In order to facilitate the explanation, only the part that is related to the embodiment of the invention is shown herein.

HFA provided in the embodiment of the invention comprises: a Hybrid Fiber Amplifier comprising a Raman fiber amplifier (RFA) 1 and an erbium-doped optical fiber amplifier (EDFA) 2 without variable optical attenuator. The RFA 1 comprises: pump signal combiner 11; pump lasers group 12 connected to reflection end of the pump signal combiner 11; an out-of-band narrow-band filter 13 that are connected to the output end of pump signal combiner 11; and a photodetector 14 that is connected to a reflection end of the out-of-band narrow-band filter 13. The EDFA 2 comprises: an input coupler 21, an erbium-doped fiber 22, an output coupler 23, an input photodetector 24 that is connected to the small end of the input coupler 21, and an output photodetector 25 that is connected to the small end of output coupler 23, which are connected sequentially, wherein the output end of the out-of-band narrow-band filter 13 is connected to input end of input coupler 21. The HFA also comprises a control module 3 that, in accordance with desired amplification requirements, controls RFA 1 and/or EDFA 2 to adjust gain and/or gain slope.

In the embodiment of the invention, the gain and gain slope of RFA 1 can be flexibly adjusted, and the gain and gain slope of EDFA 2 can also be adjusted. These adjustments can be realized via a control module 3. In practice, the control module 3 maybe a CPU and peripheral circuit thereof, controls EDFA 2 to change gain or gain slope, in correspondence to value of the optical power detected by the input photodetector 23 and output photodetector 25 of EDFA 2 and based on adjustment algorithm for desired amplification requirement. Meanwhile, it realizes adjusting the gain and gain slope by controlling pump lasers group 12 to adjust the pump power of different wavelengths in correspondence to the adjustment algorithm of photodetector 14 and RFA 1.

As an embodiment, the pump laser group 12 comprises 1400~1499 nm pump lasers with at least 2 different wavelengths, which can compensate the degradation of gain ripple resulted from change of gain slope of EDFA 2.

Generally, amplification requirement can be met by adjusting gain and gain slope of RFA 1. For wider range adjustment on gain and gain slope, it can be realized by adjusting the gain of EDFA 2 and even by adjusting the gains of RFA 1 and EDFA 2, and gain slope of RFA 1 simultaneously.

In real situation, the common desired requirement on amplification is to adjust total gain while keeping total gain slope of HFA unchanged, or to adjust total gain slope while keeping total gain of HFA unchanged. The control module 3 controls RFA 1 and/or EDFA 2 to realize the above desired amplification requirement.

Embodiment 2

In the embodiment of the invention, a method to adjust gain and gain slope of HFA as in embodiment 1, comprising RFA and EDFA without variable optical attenuator, is provided, which comprises step of:

Step S201: according to desired amplification requirements, adjusting the gain $G_R$, gain slope $T_R$ of RFA, and/or gain $G_E$ and gain slope $T_E$ of EDFA to realize adjustment of total gain $G_H$ and/or total gain slope $T_H$ of HFA.

In this step, $G_H$ (HFA total gain) equals the sum of $G_R$ (RFA gain) and $G_E$ (EDFA gain). $T_H$ (HFA total gain slope) equals the sum of $T_R$ (RFA gain slope) and $T_E$ (EDFA gain slope). The desired amplification requirement is the expected amplification adjustment effect on HFA, including $G_H$ (total gain) and/or $T_H$ (total gain slope). According to desired amplification requirement, it adjusts $G_R$ (RFA gain), $T_R$ (RFA gain slope), and/or adjusts $G_E$ (EDFA gain) and $T_E$ (EDFA gain slope). For example, it can adjust $G_H$ (HFA total gain) while keeping $T_H$ (HFA total gain slope) unchanged. In case that adjustment on $G_R$ (RFA gain) alone cannot meet gain requirement, it can also adjust $G_E$ (EDFA gain) simultaneously while adjusting $T_R$ (RFA gain slope) to compensate the change of gain slope resulted from the change of EDFA gain.

Also, in this adjustment method, the common desired amplification requirement is to adjust $G_H$ (HFA total gain) while keeping $T_H$ (HFA total gain slope) unchanged, or to adjust $T_H$ (HFA total gain slope) while keeping $G_H$ (HFA total gain) unchanged.

Figure 2:
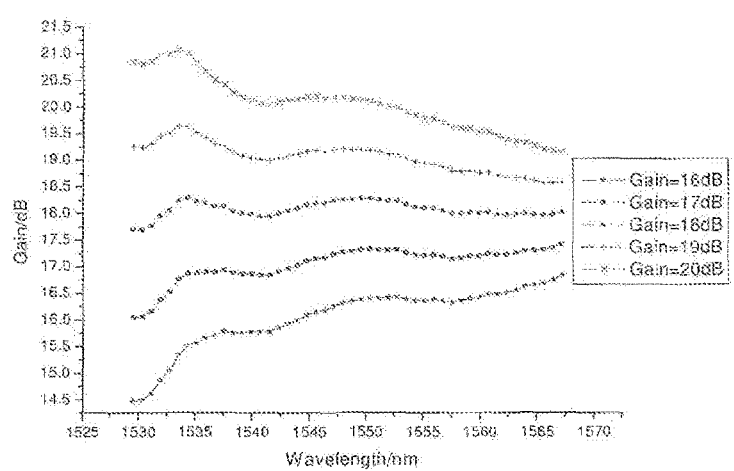
FIG. 2 shows the gain spectrum of EDFA without VOA in different gains.

In the embodiment of the invention, EDFA does not comprise VOA, therefore adding pump power to adjust $G_E$ (EDFA gain) will inevitably change $T_E$ (EDFA gain slope), and adjusting $T_E$ (EDFA gain slope) will inevitably change $G_E$ (EDFA gain). In this specific embodiment as in FIG. 2, it shows gain spectrums of EDFA without VOA in different gains, and change of EDFA gain in the range of 16~20 dB of EDFA gain, wherein, in the whole C band range of 1529~1568 nm, $T_E$ (EDFA gain slope) will change by about 0.85 dB whenever $G_E$ (EDFA gain) changes by 1 dB in inverse proportion relation, that is, meeting the relationship as:

$$\frac{dT_E}{dG_E} = -0.85,$$

Wherein $dG_E$ represents the amount of change of $G_E$ (EDFA gain), and $dT_E$ represents the amount of change of $T_E$ (EDFA gain slope).

As a specific embodiment of the invention, it can adjust RFA gain via out-of-band ASE power, and adjust RFA gain slope by adjusting power of different pump wavelengths. In adjusting EDFA gain, it follows that EDFA gain=total output power-ASE compensation power (related to gain)-input power. When changing EDFA gain, pump power can be adjusted to make the result of subtracting ASE compensation power and input power from the total output power reach desired target gain. However, after the target gain is reached, EDFA gain will generate a gain slope. RFA can compensate the gain slope change by adjusting the proportion of pump power. Also, after the adjustment of $T_E$ (EDFA gain slope), it will lead to the change of $G_E$ (EDFA gain), and RFA can compensate the adjustment amount of $T_E$ (EDFA gain slope). Thus, HFA according to embodiment of the invention is technologically viable.

In order to understand more clearly the adjustment process of HFA in the embodiment of invention, below is a detailed description about several specific embodiments.

Embodiment 3

In the embodiment of the present invention, the desired amplification requirement is to adjust $G_H$ (HFA total gain) while keeping $T_H$ (HFA total gain slope) unchanged.

In the embodiment of the present invention, $G_E$ (EDFA gain) is adjusted while keeping $G_R$ (RFA gain) unchanged. Meanwhile, $T_R$ (RFA gain slope) is adjusted to compensate change of gain slope due to change of $G_E$ (EDFA gain).

Figure 3:
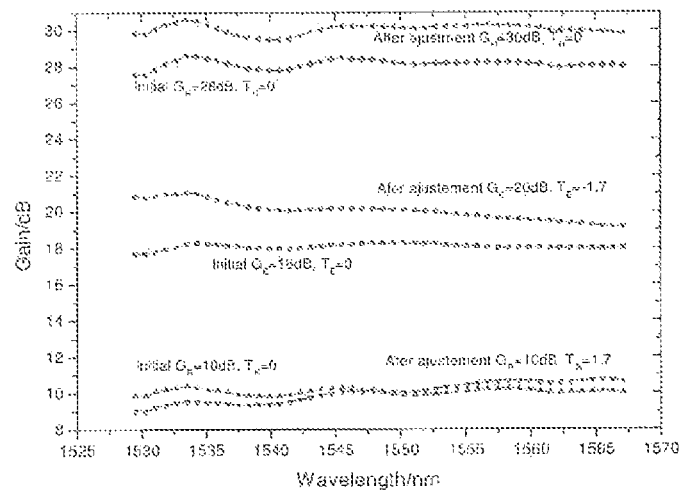
FIG. 3 shows the HFA gain variation by adjusting $G_E$ (EDFA gain) and $T_R$ (RFA gain slope).

For example, in order to change $G_H$ (HFA total gain) from 28 dB to 30 dB while keeping $T_H$ (HFA total gain slope) of 0 unchanged, as in FIG. 3, it shows that $G_E$ (EDFA gain) and $T_R$ (RFA gain slope) are adjusted to realize gain change of HFA. In FIG. 3, the initial setting of EDFA is as follows: $G_E$ (EDFA gain) of 18 dB, $T_E$ (EDFA gain slope) of 0, $G_R$ (RFA gain) of 10 dB, $T_R$ (RFA gain slope) of 0. In order to change $G_H$ (HFA total gain) from 28 dB to 30 dB, $G_E$ (EDFA gain) is adjusted first from 18 dB to 20 dB, $G_R$ (RFA gain) is kept at 10 dB. Because $G_E$ (EDFA gain) is increased by 2 dB when $G_E$ (EDFA gain) is adjusted from 18 dB to 20 dB, according to the relationship as expressed in formula:

$$\frac{dT_E}{dG_E} = -0.85,$$

$T_E$ (EDFA gain slope) is reduced by 1.7 dB from 0 to −1.7 dB. Thus, in order to keep $T_H$ (HFA total gain slope) of 0 unchanged, $T_R$ (RFA gain slope) must be increased by 1.7 dB, in order to realize the change of $G_H$ (HFA total gain) from 28 dB to 30 dB while keeping $T_H$ (HFA total gain slope) of 0 unchanged.

Embodiment 4

In the embodiment of the present invention, the desired amplification requirement is to adjust $G_H$ (HFA total gain) while keeping $T_H$ (HFA total gain slope) unchanged.

In the embodiment of the present invention, it is to adjust $G_R$ (RFA gain) only while keeping $T_R$ (RFA gain slope) and $G_E$ (EDFA gain) unchanged.

Figure 4:
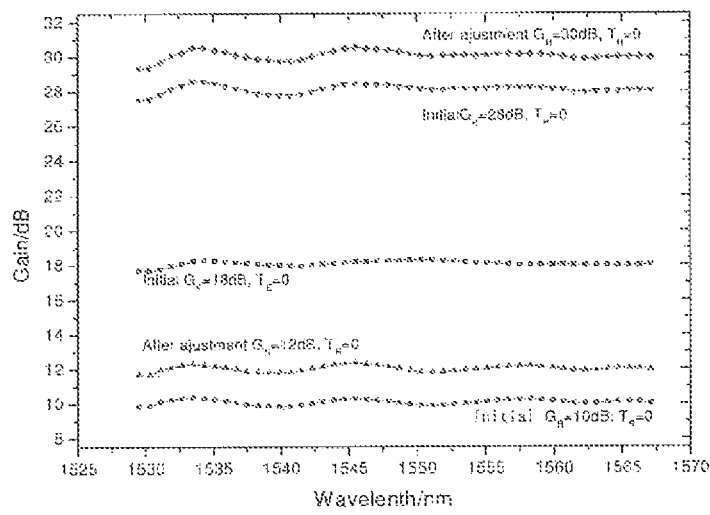
FIG. 4 shows the HFA gain variation by adjusting $G_R$ (RFA gain) only.

Also, as an example, in order to adjust $G_H$ (HFA total gain) from 28 dB to 30 dB while keeping $T_H$ (HFA total gain slope) of 0 unchanged, as in FIG. 4, it shows that only $G_R$ (RFA gain) is adjusted to realize gain change of HFA. In FIG. 4, the initial setting is as follows: $G_E$ (EDFA gain) of 18 dB, $T_E$ (EDFA gain slope) of 0, $G_R$ (RFA gain) of 10 dB, $T_R$ (RFA gain slope) of 0. In order to change $G_H$ (HFA total gain) from 28 dB to 30 dB, $G_R$ (RFA gain) is adjusted directly from 10 dB to 12 dB while keeping the others unchanged. In this way, it can change $G_H$ (HFA total gain) from 28 dB to 30 dB while keeping $T_H$ (HFA total gain slope) of 0 unchanged.

Embodiment 5

In the embodiment of the present invention, the desired amplification requirement is to adjust $G_H$ (HFA total gain) while keeping $T_H$ (HFA total gain slope) unchanged.

In the embodiment of the present invention, it is required to adjust GE (EDFA gain), GR (RFA gain) while adjusting TR (RFA gain slope) to compensate the gain slope change due to the change of GE (EDFA gain).

Figure 5:
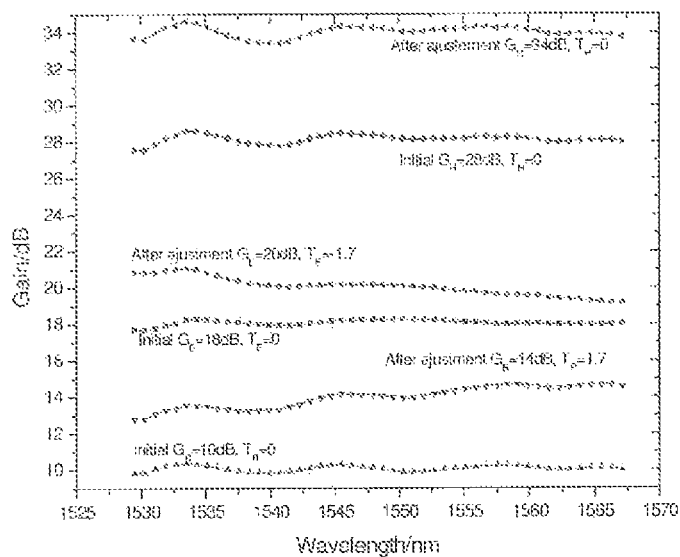
FIG. 5 shows the HFA gain variation by adjusting $G_E$ (EDFA gain), $G_R$ (RFA gain) and $T_R$ (RFA gain slope).

For example, to adjust $G_H$ (HFA total gain) from 28 dB to 34 dB while keeping $T_H$ (HFA total gain slope) of 0 unchanged, as shown in FIG. 5, it shows that $G_E$ (EDFA gain), $G_R$ (RFA gain) and $T_R$ (RFA gain slope) are adjusted simultaneously to realize gain change of HFA. In FIG. 5, the initial setting is as follows: $G_E$ (EDFA gain) of 18 dB, $T_E$ (EDFA gain slope) of 0, $G_R$ (RFA gain) of 10 dB, $T_R$ (RFA gain slope) of 0. In order to change $G_H$ (HFA total gain) from 28 dB to 34 dB, $G_E$ (EDFA gain) is adjusted from 18 dB to 20 dB and $G_R$ (RFA gain) from 10 dB to 14 dB, and $G_H$ (HFA total gain) is up from 28 dB to 34 dB. However, in the adjustment of $G_E$ (EDFA gain) from 18 dB to 20 dB, $T_E$ (EDFA gain slope) is changed from 0 to −1.7 dB, without compensation by VOA, change of $G_E$ (EDFA gain) results change of $T_E$ (EDFA gain slope), therefore, $T_R$ (RFA gain slope) must be increased by 1.7 dB at same time to keep $T_H$ (HFA total gain slope) unchanged to realize the adjustment of $G_H$ (HFA total gain) from 28 dB to 34 dB while keeping $T_H$ (HFA total gain slope) of 0 unchanged.

In the embodiment of the present invention, the gains of both of RFA and EDFA could be adjusted at a large range, which is suitable for multiple span losses.

In embodiments 3 to 5, different adjustment methods are used to realize the adjustment of $G_H$ (HFA total gain) while keeping $T_H$ (HFA total gain slope) unchanged. Generally, it is a common practice to adjust by the adjustment method as described in embodiment 4. To expand the adjustment range of HFA total gain, adjustment method in embodiment 3 can be used. In order to further realize dynamic HFA gain adjustment of large range, adjustment method in embodiment 5 can be used.

Embodiment 6

In the embodiment of the present invention, the desired amplification requirement is to adjust $G_H$ (HFA total gain) while keeping $T_H$ (HFA total gain slope) unchanged.

In the embodiment of the present invention, it adjusts $T_E$ (EDFA gain slope) to indirectly adjust $G_E$ (EDFA gain) while adjusting $T_R$ (RFA gain slope) to compensate the adjustment mount on $T_E$ (EDFA gain slope).

For example, in order to realize the adjustment of $G_H$ (HFA total gain) from 28 dB to 30 dB while keeping $T_H$ (HFA total gain slope) of 0 unchanged, as also in FIG. 3, this embodiment distinguishes from embodiment 3 in that it adjusts $T_E$ (EDFA gain slope) to realize the adjustment of $G_E$ (EDFA gain) in contrast to direct adjustment of $G_E$ (EDFA gain) in embodiment 3. In the figure, the initial setting is as follows: $G_E$ (EDFA gain) of 18 dB, $T_E$ (EDFA gain slope) of 0, $G_R$ (RFA gain) of 10 dB, $T_R$ (RFA gain slope) of 0. In the adjustment, $G_R$ (RFA gain) of 10 dB is kept unchanged. Then, it is required to adjust $G_E$ (EDFA gain) from 18 dB to 20 dB with gain change of 2 dB. According to the relationship expressed in formula:

$$\frac{dT_E}{dG_E} = -0.85,$$

$T_E$ (EDFA gain slope) is reduced from 0 to −1.7 dB with 1.7 dB reduction, Therefore $T_E$ (EDFA gain slope) is adjusted to −1.7 dB in order to realize the adjustment of $G_E$ (EDFA gain) from 18 dB to 20 dB. In order to keep $T_H$ (HFA total gain slope) of 0 unchanged, $T_R$ (RFA gain slope) must be increased by 1.7 dB to finally realize the change of HFA total gain from 28 dB to 30 dB while keeping HFA total gain slope of 0 unchanged.

Embodiment 7

In the embodiment of the present invention, the desired amplification requirement is to adjust $G_H$ (HFA total gain) while keeping $T_H$ (HFA total gain slope) unchanged.

In the embodiment of the present invention, it adjusts $T_E$ (EDFA gain slope) to indirectly adjust $G_E$ (EDFA gain) while adjusting $G_R$ (RFA gain), in addition to adjusting $T_R$ (RFA gain slope) to compensate the adjustment amount of $T_E$ (EDFA gain slope).

This embodiment distinguishes from embodiment 5 in that it adjusts $T_E$ (EDFA gain slope) to indirectly adjust $G_E$ (EDFA gain) in contrast to direct adjustment of $G_E$ (EDFA gain) in embodiment 5. Also supposing that it is required to adjust $G_H$ (HFA total gain) from 28 dB to 34 dB while keeping $T_H$ (HFA total gain slope) unchanged, as in FIG. 5, in which the initial setting is as follows: $G_E$ (EDFA gain) of 18 dB, $T_E$ (EDFA gain slope) of 0, $G_R$ (RFA gain) of 10 dB, $T_R$ (RFA gain slope) of 0, herein $G_E$ (EDFA gain) is adjusted from 18 dB to 20 dB and $G_R$ (RFA gain) from 10 dB to 14 dB. In order to adjust $G_E$ (EDFA gain) from 18 dB to 20 dB, it can adjust $T_E$ (EDFA gain slope) from 0 to −1.7 dB. Besides, in order to compensate the slope, $T_R$ (RFA gain slope) must be increased by 1.7 dB simultaneously to keep $T_H$ (HFA total gain slope) unchanged.

Embodiment 8

In the embodiment of the present invention, the desired amplification requirement is to adjust $T_H$ (HFA total gain slope) while keeping the $G_H$ (HFA total gain) unchanged.

In the embodiment of the present invention, it adjusts $T_R$ (RFA gain slope) only while keeping the $G_R$ (RFA gain) and $G_E$ (EDFA gain) unchanged.

Figure 6:
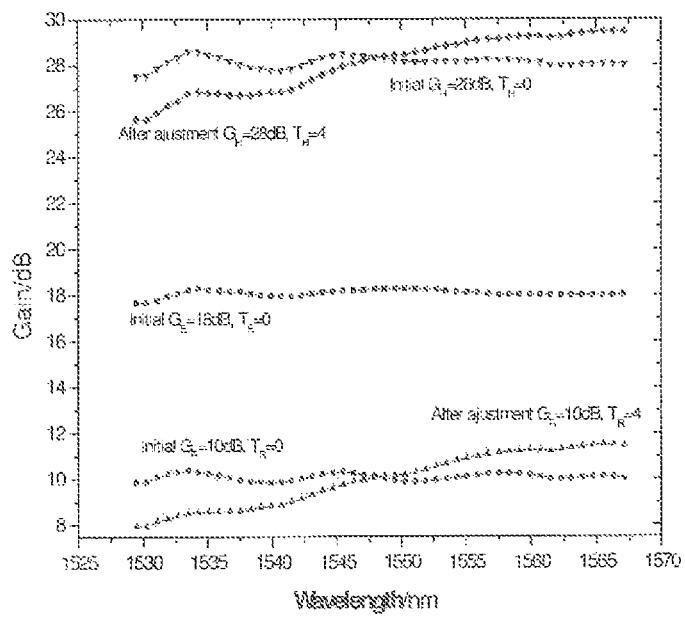
FIG. 6 shows the HFA gain adjustment by adjusting $T_R$ (RFA gain slope).

In the example of realizing the adjustment of $T_H$ (HFA total gain slope) from 0 dB to 4 dB while keeping the $G_H$ (HFA total gain) of 28 dB unchanged, as shown in FIG. 6, which shows that it adjusts $T_R$ (RFA gain slope) only to realize the change of gain slope of HFA. In the Figure, the initial setting is that $G_E$ (EDFA gain) is 18 dB, gain slope of EDFA is 0, $G_R$ (RFA gain) is 10 dB, $T_R$ (RFA gain slope) is 0. It adjusts $T_R$ (RFA gain slope) from 0 dB to 4 dB while keeping $G_R$ (RFA gain) and $G_E$ (EDFA gain) unchanged. In this way, it can realize the adjustment of $T_H$ (HFA total gain slope) from 0 dB to 4 dB while keeping the $G_H$ (HFA total gain) of 28 dB unchanged.

In a possible method of realization, for the EDFA with intermediate stage, such as the EDFA with dispersion compensator (DCM), it will generate gain slope in the EDFA gain spectrum due to the possible deviation of DCM Insertion Loss from design standard value. Generally speaking, the change of Insertion Loss by 1 dB will lead to the change of gain slope by −0.85 dB. For the traditional EDFA with variable gain, it adjusts the loss of VOA to compensate change of gain slop resulted from the deviation of DCM insertion loss from standard insertion loss. In this embodiment, it only sets the amount of change of Raman gain slope to compensate the gain slope change resulted from the change of DCM insertion loss from standard insertion loss.

Embodiment 9

In the embodiment of the present invention, the desired amplification requirement is to adjust $T_H$ (HFA total gain slope) while keeping the $G_H$ (HFA total gain) unchanged.

In the embodiment of the present invention, it adjusts $G_E$ (EDFA gain) and indirectly adjusts $T_E$ (EDFA gain slope) while adjusting $G_R$ (RFA gain) to compensate adjustment amount of $G_E$ (EDFA gain). In this embodiment, supposing the gain and gain slope of EDFA meet the mathematics relationship:

$$\frac{dT_E}{dG_E} = -0.85,$$

and it is required to reduce gain slope by 2 dB, thus it is only required to increase EDFA gain by 2.4 dB, according to the mathematics relationship above mentioned. For example, to adjust $T_H$ (HFA total gain slope) from 0 dB to −2 dB while keeping $G_H$ (HFA total gain) of 28 dB unchanged, as in FIG. 7 that indicates the adjustment of $T_E$ (EDFA gain slope) and $G_R$ (RFA gain) in order to realize gain slope change of HFA with the initial setting of $G_E$ (EDFA gain) of 18 dB, gain slope of EDFA of 0, $G_R$ (RFA gain) of 10 dB, and $T_R$ (RFA gain slope) of 0, herein $G_E$ (EDFA gain) is increased by 2.4 dB from 18 dB to 20.4 dB to indirectly adjust $T_E$ (EDFA gain slope) from 0 dB to −2 dB. In addition, it is required to adjusting $G_R$ (RFA gain) from 10 dB to 7.6 dB to compensate the increase amount of $G_E$ (EDFA gain). In this way, it can realize the change of $T_H$ (HFA total gain slope) from 0 dB to −2 dB while keeping $G_H$ (HFA total gain) of 28 dB unchanged.

Embodiment 10

In the embodiment of the present invention, the desired amplification requirement is to adjust $T_H$ (HFA total gain slope) while keeping the $G_H$ (HFA total gain) unchanged.

In the embodiment of the present invention, it adjusts $G_E$ (EDFA gain) to indirectly adjust $T_E$ (EDFA gain slope) while adjusting $T_R$ (RFA gain slope), and adjusting $G_R$ (RFA gain) at the same time, to compensate adjustment amount of $G_E$ (EDFA gain). In this embodiment, also supposing the gain and gain slope of EDFA meet the mathematics relationship:

$$\frac{dT_E}{dG_E} = -0.85$$

and if EDFA gain slope is to be reduced by 2 dB, it is only required to increase EDFA gain by 2 dB according to the mathematics relationship above mentioned.

Figure 8:
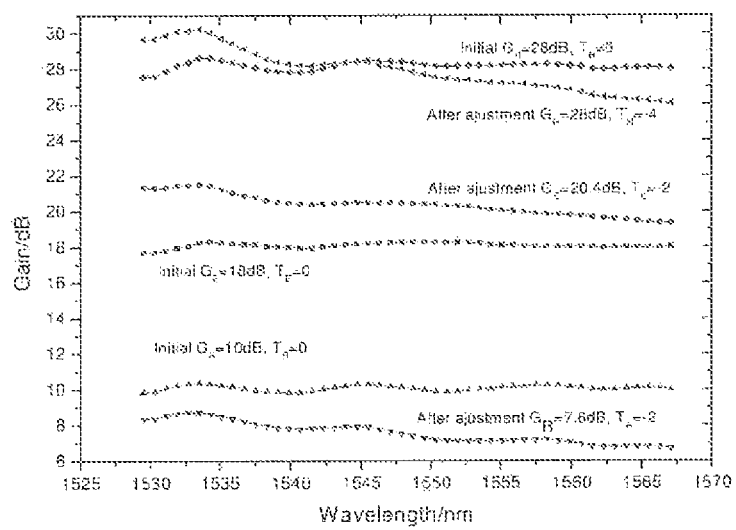
FIG. 8 shows the HFA gain adjustment by adjusting $T_E$ (EDFA gain slope), $T_R$ (RFA gain slope) and $G_R$ (RFA gain)

For example, to adjust $T_H$ (HFA total gain slope) from 0 dB to −4 dB while keeping $G_H$ (HFA total gain) of 28 dB unchanged, as in FIG. 8 that indicates the adjustment of $T_E$ (EDFA gain slope), $T_R$ (RFA gain slope) and $G_R$ (RFA gain) in order to realize gain slope change of HFA with the initial setting of $G_E$ (EDFA gain) of 18 dB, gain slope of EDFA of 0, $G_R$ (RFA gain) of 10 dB, and $T_R$ (RFA gain slope) of 0, herein $G_E$ (EDFA gain) is increased by 2.4 dB from 18 dB to 20.4 dB to indirectly adjust $T_E$ (EDFA gain slope) from 0 dB to −2 dB. Besides, to adjust $T_H$ (HFA total gain slope) from 0 dB to −4 dB, it is also required to adjust $T_R$ (RFA gain slope) from 0 dB to −2 dB, in addition to adjusting $G_R$ (RFA gain) from 10 dB to 7.6 dB to compensate the increase amount of $G_E$ (EDFA gain). In this way, it can realize the adjustment of $T_H$ (HFA total gain slope) from 0 dB to −4 dB while keeping $G_H$ (HFA total gain) of 28 dB unchanged.

In this embodiment of the invention, the gain slopes of RFA and EDFA can compensate for each other, thus widening the range of gain slope adjustment with either positive or negative adjustment amount. Besides, since EDFA does not comprise VOA, the adjustment of gain slope will not be realized at the expense of introducing additional noise figure.

Embodiment 11

In the embodiment of the present invention, the desired amplification requirement is to adjust $T_H$ (HFA total gain slope) while keeping the $G_H$ (HFA total gain) unchanged.

In the embodiment of the present invention, it adjusts $T_E$ (EDFA gain slope) while adjusting $G_R$ (RFA gain) to compensate the gain change due to the change of $T_E$ (EDFA gain slope).

Figure 7:
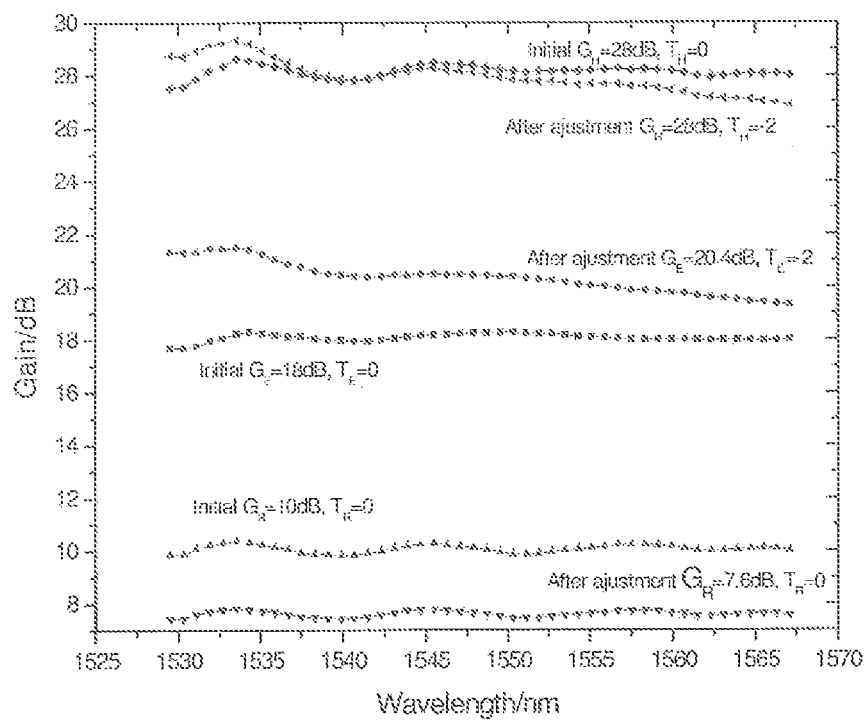
FIG. 7 shows the HFA gain adjustment by adjusting $T_E$ (EDFA gain slope) and $G_R$ (RFA gain)

It distinguishes from embodiment 9 in that it directly adjusts $T_E$ (EDFA gain slope) in contrast to the indirect adjustment of $T_E$ (EDFA gain slope) by adjusting $G_E$ (EDFA gain) in embodiment 9. Also as shown in FIG. 7, with the initial setting of $G_E$ (EDFA gain) of 18 dB, gain slope of EDFA of 0, $G_R$ (RFA gain) of 10 dB, and $T_R$ (RFA gain slope) of 0, and the gain and gain slope of EDFA meet the mathematics relationship:

$$\frac{dT_E}{dG_E} = -0.85,$$

herein the reduction of $T_E$ (EDFA gain slope) by 2 dB will increase $G_E$ (EDFA gain) by 2.4 dB. Meanwhile, the adjustment of $G_R$ (RFA gain) from 10 dB to 7.6 dB can compensate the increase amount of $G_E$ (EDFA gain). Finally, it can realize the change of $T_H$ (HFA total gain slope) from 0 dB to -2 dB while keeping $G_H$ (HFA total gain) of 28 dB unchanged.

Embodiment 12

In the embodiment of the present invention, the desired amplification requirement is to adjust $T_H$ (HFA total gain slope) while keeping the $G_H$ (HFA total gain) unchanged.

In the embodiment of the present invention, it is to adjust $T_E$ (EDFA gain slope) and $T_R$ (RFA gain slope) while adjusting $G_R$ (RFA gain) to compensate the gain change due to the change of $T_E$ (EDFA gain slope).

It distinguishes from embodiment 10 in that it directly adjusts $T_E$ (EDFA gain slope) in contrast to the indirect adjustment of $T_E$ (EDFA gain slope) by adjusting $G_E$ (EDFA gain) in embodiment 10. Also in FIG. 8 with the initial setting of $G_E$ (EDFA gain) of 18 dB, gain slope of EDFA of 0, $G_R$ (RFA gain) of 10 dB, $T_R$ (RFA gain slope) of 0, and it is required to keep $G_H$ (HFA total gain) of 28 dB unchanged and change $T_H$ (HFA total gain slope) from 0 dB to -4 dB, herein it adjusts $T_E$ (EDFA gain slope) and $T_R$ (RFA gain slope) from 0 dB to -2 dB. At this time, $G_E$ (EDFA gain) changes from 18 dB to 20.4 dB, and $G_R$ (RFA gain) can be adjusted from 10 dB to 7.6 dB to compensate the increase amount of $G_E$ (EDFA gain) in order to keep $G_H$ (HFA total gain) of 28 dB unchanged.

In embodiments 8-12, different methods are used to realize the adjustment of $T_H$ (HFA total gain slope) while keeping $G_H$ (HFA total gain) unchanged. Generally, it can only adjust $T_R$ (RFA gain slope) to realize the adjustment as described in embodiment 8. For RFA with single wavelength pump in which gain slope cannot be adjusted, methods in embodiment 9 or 11 can be used to realize the adjustment. In special cases in that due to the limit on pump power of RFA, certain gain setting cannot meet gain slope requirement and adjustment of only gain slope of RFA or EDFA alone cannot meet the gain slope adjustment requirement, it can be realized by adjusting the slope of both of them, such as by the methods in embodiment 10 or 12.

It must be noted that, in certain optical communication systems, for EDFA with DCM intermediate stage, the existing technologies will generally introduce extra VOA to compensate the change of gain slope resulted from DCM insertion loss. In the present invention and according to the method provided in embodiment 8, however, it adjusts gain slope of RFA to compensate the gain slope change due to insertion loss of DCM with different intermediate stages in EDFA.

Embodiment 13

Figure 9:
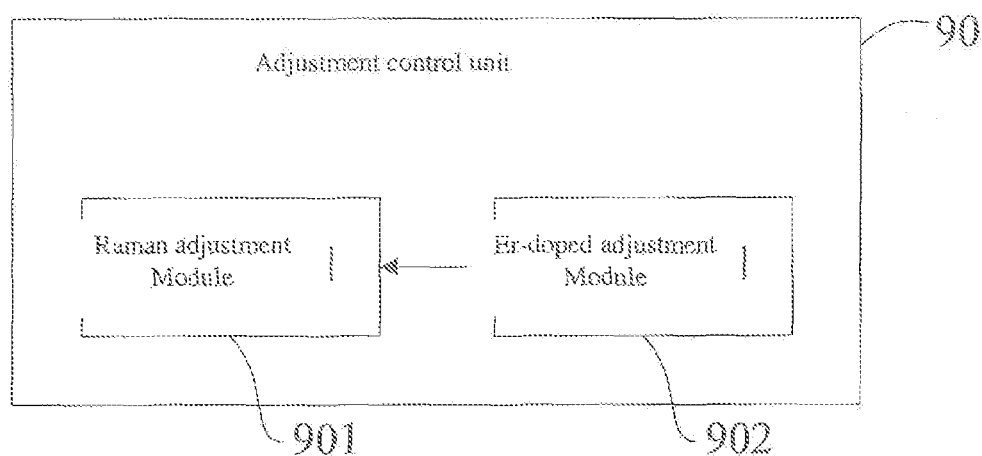
FIG. 9 shows the structure of adjustment apparatus on gain, gain slope of HFA in the embodiment of the present invention.

In the embodiment of the present invention, it provides an adjustment apparatus for the gain and gain slope of HFA, as in FIG. 9, comprising adjustment control unit 90 that in accordance with desired amplification requirement including $G_H$ (HFA total gain) and/or $T_H$ (HFA total gain slope), adjusts RFA and/or EDFA. The adjustment control unit 90 comprises Raman adjustment module 901 and/or Erbium-doped adjustment module 902, wherein Raman adjustment module 901 adjusts $G_R$ (RFA gain) and $T_R$ (RFA gain slope) and Erbium-doped adjustment module 902 adjusts $G_E$ (EDFA gain), and $T_E$ (EDFA gain slope).

In embodiment of the present invention, the adjustment control unit 90 realizes the adjustment as in embodiment 1. The adjustment control unit 90 can, in light of the desired amplification requirements and amplification capacity of RFA and EDFA of HFA, chooses the appropriate amplification control method, and performs corresponding amplification operation by controlling RFA via the Raman adjustment module 901 and/or controlling EDFA via the Erbium-doped adjustment module 902. For example, Erbium-doped adjustment module 902 can adjust gain slope of RFA according to gain slope compensation method for intermediate stage insertion loss, and Erbium-doped adjustment module 902 and Raman adjustment module 901 can determine their respective adjustment amounts according to the mathematics relationship between gain and gain slope of EDFA and make adjustment on RFA and EDFA accordingly.

To sum up, in the embodiments of the present invention, it can realize dynamic adjustment on both gain and gain slope of RFA in HFA, and can also realize the dynamic adjustment on both gain and gain slope of EDFA without VOA. The total gain adjustment of HFA can be realized by adjusting RFA gain and EDFA gain separately or simultaneously, and the total gain slope adjustment of HFA can be realized by adjusting RFA gain slope separately or RFA gain slope and EDFA gain slope separately or simultaneously. HFA provided in this embodiment of invention can, in accordance with desired amplification requirement, controls RFA and EDFA for coordinated adjustment to realize the desired adjustment effect.

The above mentioned are the optimal embodiments to which the present invention is applied, and can't restrict the the present invention. The amendment(s), equivalent replacement(s), modification(s), and etc., without departing from the spirit and principle of the present invention, shall all fall within the scope of protection of the invention.

What is claimed is:
1. A Hybrid Fiber Amplifier comprising a Raman fiber amplifier, and an erbium-doped optical fiber amplifier without variable optical attenuator, wherein the Raman fiber amplifier comprises: pump signal combiner; pump laser group connected to a reflection end of the pump signal combiner; an out-of-band narrow-band filter connected to an output end of the pump signal combiner; a photodetector connected to a reflection end of out-of-band narrow-band filter, wherein the erbium-doped optical fiber amplifier comprises, in sequential connection: an input coupler; an erbium-doped fiber; an output coupler; an input photodetector connected to a small end of the input coupler; and an output photodetector connected to a small end of the output coupler, wherein the output end of out-of-band narrow-band filter is connected with the input end of input coupler, wherein the Hybrid Fiber Amplifier also comprises a control module that, in accordance with desired amplification requirements, controls the gain and/or gain slope of the Raman fiber amplifier and the gain and/or gain slope of the erbium-doped optical fiber amplifier to adjust total gain and/or total gain slope of the Hybrid Fiber Amplifier.

2. The Hybrid Fiber Amplifier as claimed in claim 1, wherein the control module is for controlling the Raman fiber amplifier and the erbium-doped optical fiber amplifier, so as to adjust total gain of the Hybrid Fiber Amplifier while keeping total gain slope of the Hybrid Fiber Amplifier unchanged.

3. The Hybrid Fiber Amplifier as claimed in claim 1, wherein the control module is for controlling the Raman fiber amplifier and the erbium-doped optical fiber amplifier so as to adjust total gain slope of the Hybrid Fiber Amplifier while keeping total gain of the Hybrid Fiber Amplifier unchanged.

4. An adjustment method for adjusting total gain and/or total gain slope of a hybrid fiber amplifier comprising a Raman fiber amplifier and an erbium-doped optical fiber amplifier without variable optical attenuator, wherein the adjustment method includes step of:

according to desired amplification requirements, adjusting gain GR and/or gain slope TR of the Raman fiber amplifier, and/or adjusting gain GE and/or gain slope TE of the erbium-doped optical fiber amplifier, so as to adjust total gain GH and/or total gain slope TH of the hybrid fiber amplifier.

5. The adjustment method as claimed in claim 4, wherein said step of according to desired amplification requirements, adjusting gain GR and/or gain slope TR of the Raman fiber amplifier, and/or adjusting gain GE and/or gain slope TE of the erbium-doped optical fiber amplifier, so as to adjust total gain GH and/or total gain slope TH of the hybrid fiber amplifier includes step of:

adjusting gain GR and/or gain slope TR of the Raman fiber amplifier, and/or adjusting gain GE and/or gain slope TE of the erbium-doped optical fiber amplifier, so as to adjust the total gain GH while keeping total gain slope TH of the hybrid fiber amplifier unchanged.

6. The adjustment method as claimed in claim 4, wherein said step of according to desired amplification requirements, adjusting gain GR and/or gain slope TR of the Raman fiber amplifier, and/or adjusting gain GE and/or gain slope TE of the erbium-doped optical fiber amplifier, so as to adjust total gain GH and/or total gain slope TH of the hybrid fiber amplifier includes step of:

adjusting gain GR and/or gain slope TR of the Raman fiber amplifier, and/or adjusting gain GE and/or gain slope TE of the erbium-doped optical fiber amplifier, so as to adjust the total gain slope TH while keeping total gain GH of the hybrid fiber amplifier unchanged.

7. The adjustment method as claimed in claim 5, wherein said step of adjusting gain GR and/or gain slope TR of the Raman fiber amplifier, and/or adjusting gain GE and/or gain slope TE of the erbium-doped optical fiber amplifier, so as to adjust the total gain GH while keeping total gain slope TH of the hybrid fiber amplifier unchanged includes step of:

adjusting gain GE of the erbium-doped optical fiber amplifier, keeping gain GR of the Raman fiber amplifier unchanged, while adjusting gain slope TR of the Raman fiber amplifier, so as to compensate change of the gain slope resulted from the change of gain GE of the erbium-doped optical fiber amplifier; or adjusting the gain GR of the Raman fiber amplifier only while keeping the gain slope TR of the Raman fiber amplifier and the gain GE of the erbium-doped optical fiber amplifier unchanged; or adjusting the gain GE of the erbium-doped optical fiber amplifier and the gain GR of the Raman fiber amplifier, while adjusting the gain slope TR of the Raman fiber amplifier, to compensate the gain slope change resulted from the change of the gain GE of the erbium-doped optical fiber amplifier; or adjusting the gain slope TE of the erbium-doped optical fiber amplifier to indirectly adjust the gain GE of the erbium-doped optical fiber amplifier, while adjusting the gain slope TR of the Raman fiber amplifier, to compensate adjustment mount of the gain slope TE of the erbium-doped optical fiber amplifier; or adjusting the gain slope TE of the erbium-doped optical fiber amplifier to indirectly adjust the gain GE of the erbium-doped optical fiber amplifier, while adjusting the gain GR of the Raman fiber amplifier and adjusting the gain slope TR of the Raman fiber amplifier, to compensate adjustment mount of the gain slope TE of the erbium-doped optical fiber amplifier.

8. The adjustment method as claimed in claim 6, wherein said step of adjusting gain GR and/or gain slope TR of the Raman fiber amplifier, and/or adjusting gain GE and/or gain slope TE of the erbium-doped optical fiber amplifier, so as to adjust the total gain slope TH while keeping total gain GH of the hybrid fiber amplifier unchanged includes step of:

adjusting the gain slope TR of the Raman fiber amplifier only while keeping the gain GR of the Raman fiber amplifier and the gain GE of the erbium-doped optical fiber amplifier unchanged; or adjusting the gain GE of the erbium-doped optical fiber amplifier to indirectly adjust the gain slope TE of the erbium-doped optical fiber amplifier, while adjusting the gain GR of the Raman fiber amplifier to compensate adjustment mount of the gain GE of the erbium-doped optical fiber amplifier; or adjusting the gain GE of the erbium-doped optical fiber amplifier to indirectly adjust the gain slope TE of the erbium-doped optical fiber amplifier, while adjusting the gain slope TR of the Raman fiber amplifier and adjusting the gain GR of the Raman fiber amplifier to compensate adjustment mount of the gain GE of the erbium-doped optical fiber amplifier; or adjusting the gain slope TE of the erbium-doped optical fiber amplifier while adjusting the gain GR of the Raman fiber amplifier to compensate change of gain resulted from change of the gain slope TE of the erbium-doped optical fiber amplifier; or adjusting the gain slope TE of the erbium-doped optical fiber amplifier and the gain slope TR of the Raman fiber amplifier, while adjusting the gain GR of the Raman fiber amplifier to compensate change of the gain resulted from the change of the gain slope TE of the erbium-doped optical fiber amplifier.

9. The adjustment method as claimed in claim 7, wherein within a certain wavelength range, when the gain GE of the erbium-doped optical fiber amplifier is adjusted, the gain slope TE of the erbium-doped optical fiber amplifier changes proportionally; when the gain slope TE of the erbium-doped optical fiber amplifier, the gain GE of the erbium-doped optical fiber amplifier changes proportionally.

10. The adjustment method as claimed in claim 9, wherein within the wavelength range of 1529-1568 nm, the gain GE of the erbium-doped optical fiber amplifier and the gain slope TE of the erbium-doped optical fiber amplifier meet relation of $$\frac{dT_E}{dG_E} = -0.85,$$

wherein $dG_E$ represents the amount of change of the gain GE of the erbium-doped optical fiber amplifier, and $dT_E$ represents the amount of change of the gain slope TE of the erbium-doped optical fiber amplifier.

11. The adjustment method as claimed in claim 9, wherein the gain GE and the gain slope TE of the erbium-doped optical fiber amplifier are adjusted according to value of optical power detected by the input photodetector and the output photodetector,
wherein the gain GR of the Raman fiber amplifier is adjusted by controlling the power of out of band amplified spontaneous emission, and
wherein the gain slope TR of the Raman fiber amplifier is adjusted by controlling pump power of different pump wavelengths in the pump laser group.

12. The adjustment method as claimed in claim 8, wherein within a certain wavelength range, when the gain GE of the erbium-doped optical fiber amplifier is adjusted, the gain slope TE of the erbium-doped optical fiber amplifier changes proportionally; when the gain slope TE of the erbium-doped optical fiber amplifier, the gain GE of the erbium-doped optical fiber amplifier changes proportionally.

13. The adjustment method as claimed in claim 12, wherein within the wavelength range of 1529-1568 nm, the gain GE of the erbium-doped optical fiber amplifier and the gain slope TE of the erbium-doped optical fiber amplifier meet relation of $$\frac{dT_E}{dG_E} = -0.85,$$

wherein $dG_E$ represents the amount of change of the gain GE of the erbium-doped optical fiber amplifier, and $dT_E$ represents the amount of change of the gain slope TE of the erbium-doped optical fiber amplifier.

14. The adjustment method as claimed in claim 12, wherein the gain GE and the gain slope TE of the erbium-doped optical fiber amplifier are adjusted according to value of optical power detected by the input photodetector and the output photodetector,
wherein the gain GR of the Raman fiber amplifier is adjusted by controlling the power of out of band amplified spontaneous emission, and
wherein the gain slope TR of the Raman fiber amplifier is adjusted by controlling pump power of different pump wavelengths in the pump laser group.

* * * * *